United States Patent
Sakakibara (10) Patent No.: US 7,778,223 B2
(45) Date of Patent: Aug. 17, 2010

(54) CORDLESS COMMUNICATION APPARATUS

(75) Inventor: Shinichi Sakakibara, Aichi (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 454 days.

(21) Appl. No.: 11/566,763

(22) Filed: Dec. 5, 2006

(65) Prior Publication Data

US 2007/0087718 A1 Apr. 19, 2007

(30) Foreign Application Priority Data

Dec. 9, 2005 (JP) ............................. 2005-355914

(51) Int. Cl.
*H04Q 7/00* (2006.01)

(52) U.S. Cl. ..................... 370/334; 455/75; 455/33; 455/345; 455/138; 455/136; 455/188.1; 455/234.1; 455/240.1; 455/241.1; 455/115.1; 370/315; 370/376; 370/347; 370/338; 370/337

(58) Field of Classification Search ................. 343/853; 455/446, 453, 562, 522, 249.1, 24, 232.1, 455/245.1, 75, 136; 330/252; 375/148; 329/318; 370/315, 337, 347
See application file for complete search history.

(56) References Cited

U.S. PATENT DOCUMENTS

| | | | |
|---|---|---|---|
| 2,817,835 A * | 12/1957 | Worthington, Jr. .......... 342/149 |
| 5,430,769 A | 7/1995 | Patsiokas et al. | |
| 5,648,992 A | 7/1997 | Wright | |
| 5,838,674 A * | 11/1998 | Forssen et al. .............. 370/337 |
| 5,859,875 A | 1/1999 | Kato et al. | |
| 6,020,784 A * | 2/2000 | Fujii ........................... 329/318 |
| 6,104,356 A * | 8/2000 | Hikuma et al. .............. 343/853 |
| 2003/0060204 A1* | 3/2003 | Francl et al. ................. 455/446 |

(Continued)

FOREIGN PATENT DOCUMENTS

EP 1498981 A 1/2005

(Continued)

OTHER PUBLICATIONS

European Search Report (EP Appln. No. 06256077—counterpart of above-captioned U.S. patent application) dated May 30, 2007.

(Continued)

*Primary Examiner*—Rafael Pérez-Gutiérrez
*Assistant Examiner*—Joseph Arevalo
(74) *Attorney, Agent, or Firm*—Baker Botts L.L.P.

(57) ABSTRACT

Whether the reception electric field level of the antenna #1 is higher than the predetermined level is judged. If the reception electric field level of the antenna #1 is not higher than the predetermined level, the communication mode is to be set to the multi-slot mode, and then whether the reception electric field level of the antenna #1 is higher is judged by comparison of the reception electric field level of the antenna #1 and the reception electric field level of the antenna #2. If the reception electric field level of the antenna #1 is higher, the call mode is to be set to the antenna #1 for executing transmission and reception, or if the reception electric field level of the antenna #1 is not higher, the communication mode is to be set to the antenna #2 for executing transmission and reception.

7 Claims, 7 Drawing Sheets

U.S. PATENT DOCUMENTS

| | | | |
|---|---|---|---|
| 2003/0119558 A1* | 6/2003 | Steadman et al. | 455/562 |
| 2003/0164734 A1* | 9/2003 | Ikeda et al. | 330/252 |
| 2003/0214919 A1* | 11/2003 | Kilfoyle et al. | 370/315 |
| 2004/0013172 A1* | 1/2004 | Hashiguchi et al. | 375/148 |
| 2005/0048985 A1* | 3/2005 | Haartsen | 455/453 |
| 2006/0077920 A1* | 4/2006 | Kilfoyle et al. | 370/315 |

FOREIGN PATENT DOCUMENTS

| | | |
|---|---|---|
| GB | 2246686 A | 2/1992 |
| JP | H06-077942 A | 3/1994 |
| JP | H10-107685 A | 4/1996 |
| JP | H8503590 | 4/1996 |
| JP | H9162850 | 6/1997 |
| JP | H11308123 | 11/1999 |
| JP | 2003169010 A | 6/2003 |
| JP | 2005217590 | 8/2005 |
| WO | 9602984 A | 2/1996 |
| WO | 0152429 A1 | 7/2001 |

OTHER PUBLICATIONS

Notification of Reason of Rejection for Japanese Patent Application No. 2005-355915, dated May 23, 2008.

European Patent Office, European Search Report for EP Appl'n No. 062560779 (counterpart to above-captioned patent appl'n) mail date of Mar. 22, 2007.

IEEE, Irvine, J. et al., "Link adaptation to improve coverage in the TETRA Private Mobile Radio System," pp. 1091-1095, IEE VTS 50th Amsterdam, Netherlands, Sep. 19-22, 1999.

Japanese Patent Office, Notification of Reasons of Rejection for Japanese Patent Application No. 2005-355914 (counterpart to above-captioned patent application), dated May 27, 2008.

* cited by examiner

CORDLESS COMMUNICATION APPARATUS

CROSS REFERENCE TO RELATED APPLICATION

This application claims priority from Japanese Patent Application No. 2005-355914, filed on Dec. 9, 2005, the entire subject matter of which is incorporated herein by reference.

BACKGROUND

1. Technical Field

The present invention relates to a cordless communication apparatus configured to communicate by switching a communication mode between a single-slot mode and a multi-slot mode.

2. Related Art

There is known a cordless communication apparatus such as telephone equipment for executing wireless communication between a main telephone and a cordless handset. Typically, a communication between the main telephone and the cordless handset is executed such that the communication mode is switched between a single-slot mode which is for communicating by using one time slot in one frame which is divided into a plurality of time slots (i.e., a single-slot mode), and a multi-slot mode which is for transmitting identical information by using a plurality of time slots in the case of poor communication conditions. An example of such a cordless communication apparatus is disclosed in Japanese Patent Provisional Publication No. HEI 11-308123.

Figure 7A:
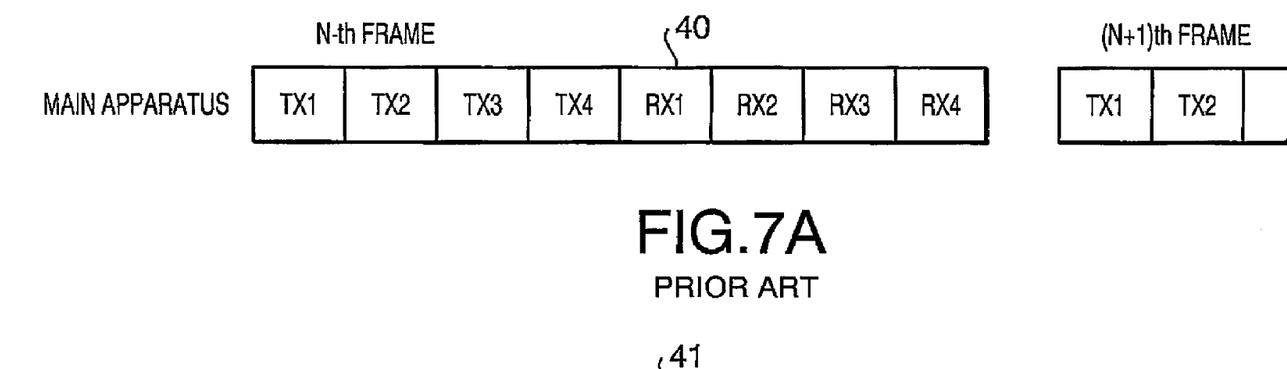
FIGS. 7A and 7B show a frame format showing a configuration of communication frames under the conventional technology.
Figure 7B:
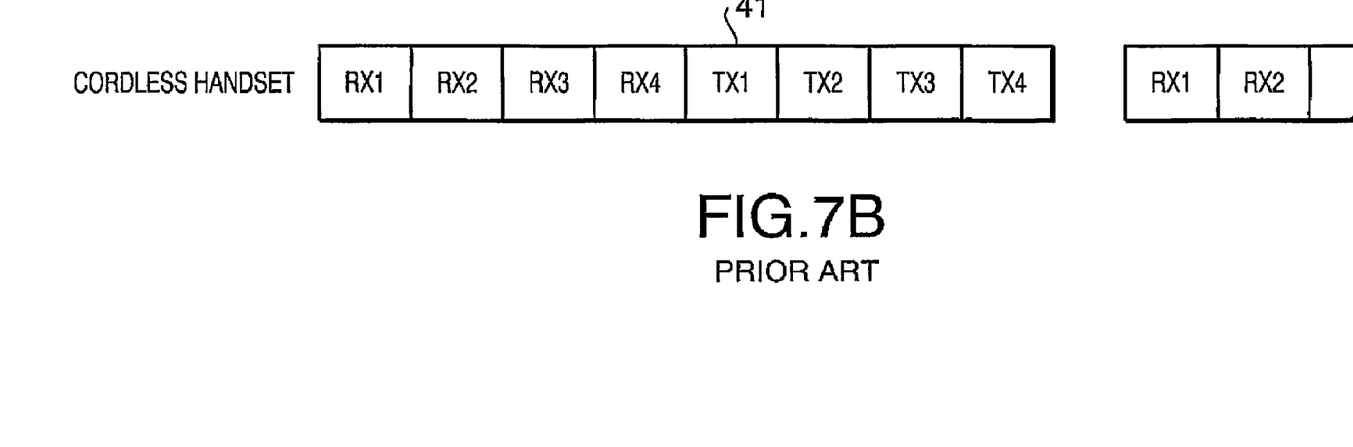

FIGS. 7A and 7B show an exemplary frame format showing a configuration of frames used for executing transmission and reception of data between the main telephone and the cordless handset. According to FIGS. 7A and 7B, 40 denotes a frame format of the main telephone and 41 denotes a frame format of the cordless handset. Each frame has four slots (TX1-TX4) in the transmission side, and four slots (RX1-RX4) in the reception side. One of the four slots for transmission is used for making a telephone call and one of the four slots for reception is used for receiving a call. When a slot *1 is used as a call slot, slots *2-*4 become open slots which are to be used for communication including communication of control data. A communication according to a frequency-hopping spread spectrum technology is executed by changing the channel (frequency) to be used with respect to each frame. Therefore, a channel (frequency) used in an N-th frame (frame N) is different from a channel (frequency) used in an (N+1)-th frame (frame N+1).

In the case of a single-slot mode, transmission is executed using one of the transmission slots (e.g., TX1) in the N-th frame, and reception is executed using one of the reception slots (e.g., RX1). In the case of a multi-slot mode, transmission is executed using one of the transmission slots (e.g., TX1) in the N-th frame and also using the transmission slots (e.g., TX2) in the (N+1)-th frame for transmitting the same information, and reception is executed using one of the reception slots (e.g., RX1) and also using another one of the reception slots (e.g., RX2) which is in the (N+1)-th frame for receiving the same information.

After received the two slots, one of the data which is lower in the error rate, which is judged by comparison of each bit error rate of the slots, is to be converted into audio data to output. Therefore, the multi-slot mode enables precise communication even in poor communication conditions such as in a weak electric field. It should be noted, however, the multi-slot mode has a drawback in that power consumption in the multi-slot mode is larger than that of the single-slot mode, that may shorten available time of the cordless handset which uses batteries.

SUMMARY OF THE INVENTION

Aspects of the invention provide a cordless communication apparatus capable of maintaining communication quality even in a weak electric field, is provided.

BRIEF DESCRIPTION OF THE ACCOMPANYING DRAWINGS

FIGS. 3A-3D illustrate display screens for setting a call mode according to an embodiment of the present invention, wherein

DESCRIPTION

General Overview

It is noted that various connections are set forth between elements in the following description. It is noted that these connections in general and unless specified otherwise, may be direct or indirect and that this specification is not intended to be limiting in this respect. Aspects of the invention may be implemented in computer software as programs storable on computer-readable media including but not limited to RAMs, ROMs, flash memory, EEPROMs, CD-media, DVD-media, temporary storage, hard disk drives, floppy drives, permanent storage, and the like.

According to aspects of the invention, there is provided a cordless communication apparatus, which is provided with a communication mode setting unit configured to switch between a single-slot mode for executing communication using one of a plurality of slots included in one frame, and a multi-slot mode for executing communication using more than one slots of the plurality of slots included in one frame, a wireless communication being executed in a communication mode selected by the communication mode setting unit, an antenna setting unit configured to switch between a first antenna and a second antenna, a communication condition detecting unit configured to detect a communication condition of each of the first antenna and the second antenna, and a controlling unit configured to control the antenna setting unit such that, when the communication condition of the first antenna detected by the communication condition detecting unit is better than a predetermined communication condition, the controlling unit controls the antenna setting unit to select the first antenna for reception and control the communication mode setting unit to set the communication mode to the single-slot mode, and when the communication condition of the first antenna detected by the communication condition detecting unit is not better than a predetermined communication condition, the controlling unit compares the condition of the first antenna with the condition of the second antenna, and if the communication condition of the second antenna detected by the communication condition detecting unit is better than the communication condition of the first antenna detected by the communication condition detecting unit, the controlling unit controls the antenna setting unit to select the second antenna for reception and controls the communication mode setting unit to set the communication mode to the multi-slot mode.

The cordless communication apparatus according to the above configuration, good communication conditions can be maintained without degrading call quality even in poor communication conditions. Further, when the multi-slot mode is selected, the communication mode here is set to the single-slot mode when communication condition is well, thus power consumption comes to be small.

The communication condition detecting unit may be provided with a reception electric field level detecting unit to detect reception electric field levels of the first antenna and the second antenna, the predetermined condition including a condition where the reception electric field level is greater than a predetermined value.

The cordless communication apparatus may be provide with an amplifier configured to amplify electric field signal received by either of the first antenna and the second antenna. The controlling unit may set a gain of the amplifier to a first value when the reception electric field level detected by the reception electric field level detecting unit is higher than the predetermined level, while the controlling unit may set the gain of the amplifier to a second value which is larger than the first value when the reception electric field level detected by the reception electric field level detecting unit is not higher than the predetermined level.

The communication condition detecting unit may be provided with a bit error rate detecting unit configured to detect a bit error rate of a digital signal received by each of the first antenna and the second antenna, the predetermined condition including a condition where the bit error rate is less than a predetermined value.

By detecting and comparing the bet error rates, accurate judgment can be made in a state with obstructive reception factors such as noises or jamming exist.

According to aspects of the invention, there is provided a cordless communication apparatus, which is provided with a communication mode setting unit configured to switch between a single-slot mode for executing communication using one of a plurality of slots included in one frame, and a multi-slot mode for executing communication using more than one slots of the plurality of slots included in one frame, a wireless communication being executed in a communication mode selected by the communication mode setting unit, a reception electric field level detecting unit configured to detect reception electric field level of an antenna, an amplifier configured to amplify an electric field signal received by the antenna, and a controlling unit configured to set a gain of the amplifier to a first value when the reception electric field level detected by the reception electric field level detecting unit is higher than a predetermined level, and to control the communication mode setting unit to set the communication mode to the single-slot mode, the controlling unit setting the gain of the amplifier to a second value which is larger than the first value when the reception electric field level detected by the reception electric field level detecting unit is not higher than the predetermined level and to control the communication mode setting unit to set the communication mode to the multi-slot mode.

According to the above configuration, good communication conditions can be maintained without degrading call quality even in a weak electric field. Further, the communication mode can be changed to the single-slot mode which has low power consumption in comparison with the multi-slot mode when communication condition is well, thus power consumption can be suppressed.

The communication mode setting unit may be provided with an operating member configured to select the communication mode to arbitrary one of the single-slot mode and the multi-slot mode.

According to the above configuration, a user can set a desired communication mode depending on the communication conditions and the like.

Embodiments

Hereinafter, referring to accompanying drawings, embodiments of the present invention will be described.

Figure 1:
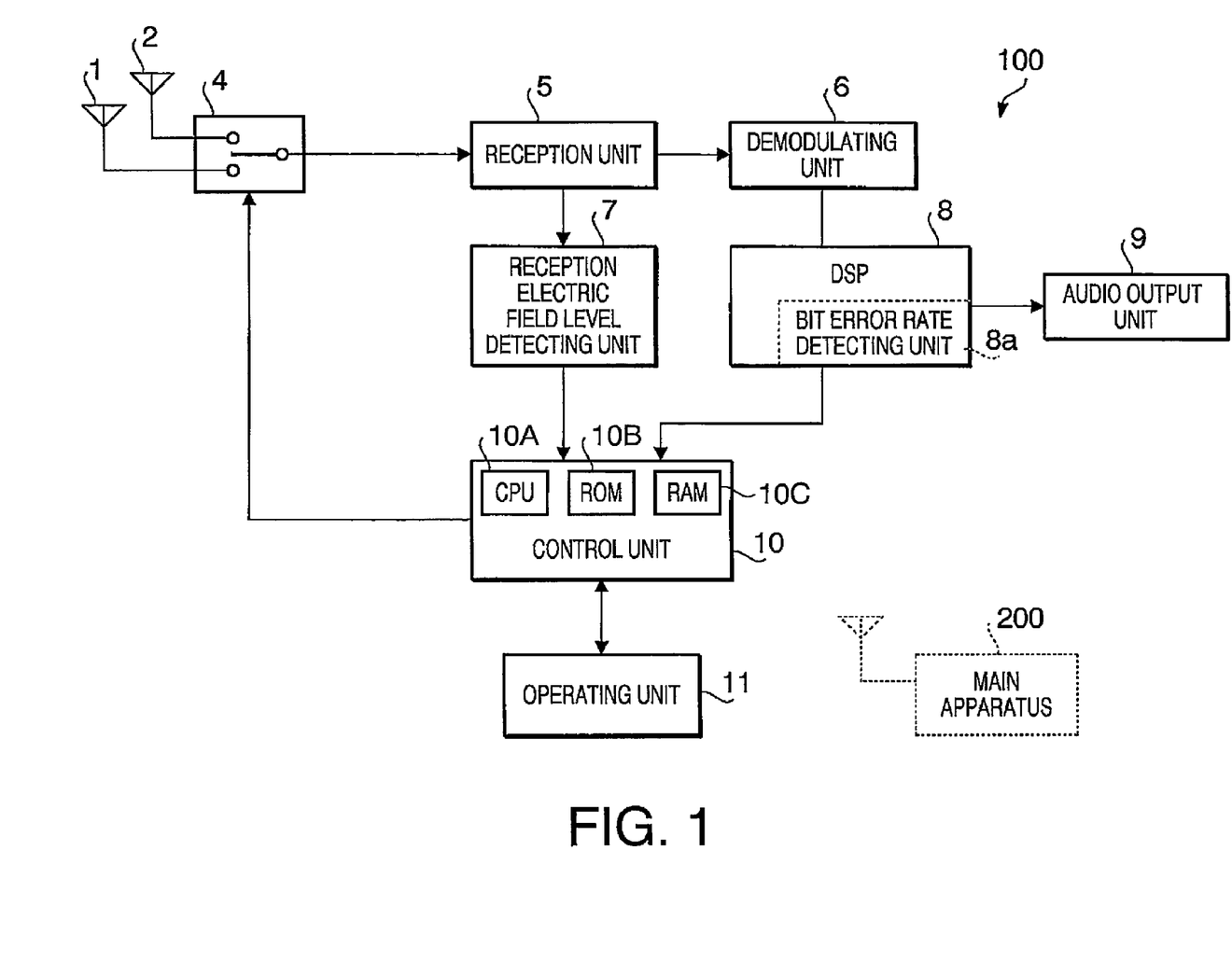
FIG. 1 is a block diagram showing a configuration of a cordless communication apparatus according to a first embodiment of the present invention.

FIG. 1 is a block diagram showing an electrical configuration of a cordless communication apparatus 100 according to aspects of the present invention. The cordless communication apparatus 100 according to the embodiment is a cordless handset of digital cordless telephone equipment which communicates with a main apparatus 200 using a frequency-hopping spread spectrum technology while changing the channel (frequency) to be used with respect to each frame, which is configured with four transmission slots and four reception slots as in the conventional system shown in FIG. 7.

FIG. 1 is a block diagram showing a configuration of a reception part of the cordless communication apparatus 100 according to a first embodiment of the present invention, and the other a transmission part is omitted. As shown in FIG. 1, the cordless communication apparatus 100 is provided chiefly with a main antenna 1, a sub-antenna 2, an antenna selector switch 4, a receiving unit 5, a demodulating unit 6, a reception electric field level detecting unit 7, a DSP 8 (digital signal processor), an audio output unit 9, a control unit 10, and an operating unit 11.

The main antenna 1 is an antenna with high receiving sensitivity which projects outwardly from the body of the cordless communication apparatus 100. The sub-antenna 2 is lower in sensitivity than the main antenna 1, and is formed inside the body of the cordless communication apparatus 100, having different directional characteristics from the main antenna 1, however, sometimes the sub-antenna 2 is higher in the reception electric field level than the main antenna 1 depending on electrical wave conditions.

The antenna selector switch 4 is a switch to select between the main antenna 1 and the sub-antenna 2 to receive a transmission depending on communication conditions. The main antenna 1 and the sub-antenna 2 are switched by the antenna selector switch 4 as necessary, so that the reception electric field level and bit error rate are detected and the communication conditions are to be judged.

The receiving unit 5 converts the electric wave signals received by the antennas 1 and 2 into level signals for detecting the reception electric field level, and outputs them to the reception electric field level detecting unit 7 while outputs the received data, from which the carrier is removed, to the demodulating unit 6.

The demodulating unit 6 demodulates inputted reception data into a digital value, and outputs it to the DSP 8. The DSP 8 is provided with a bit error rate detecting unit 8a which detects a bit error rate based on the digital value inputted from the demodulating unit 6. The bit error rate is detected by computing the rate of the bits which have not been received correctly to a known digital value contained in the reception data. The DSP 8 detects audio data contained in the reception data and outputs it to the audio output unit 9. The audio output unit 9 executes a D/A conversion from the audio data inputted from DSP 8, and drives a speaker.

The control unit 10 is provided with a microcomputer which includes a CPU (Central Processing Unit) 10A, a ROM (Read Only Memory) 101B, and a RAM (Random Access Memory) 10C, and the CPU 10A controls the cordless communication apparatus 100 by executing the control program stored in the ROM 10B.

Figure 4:
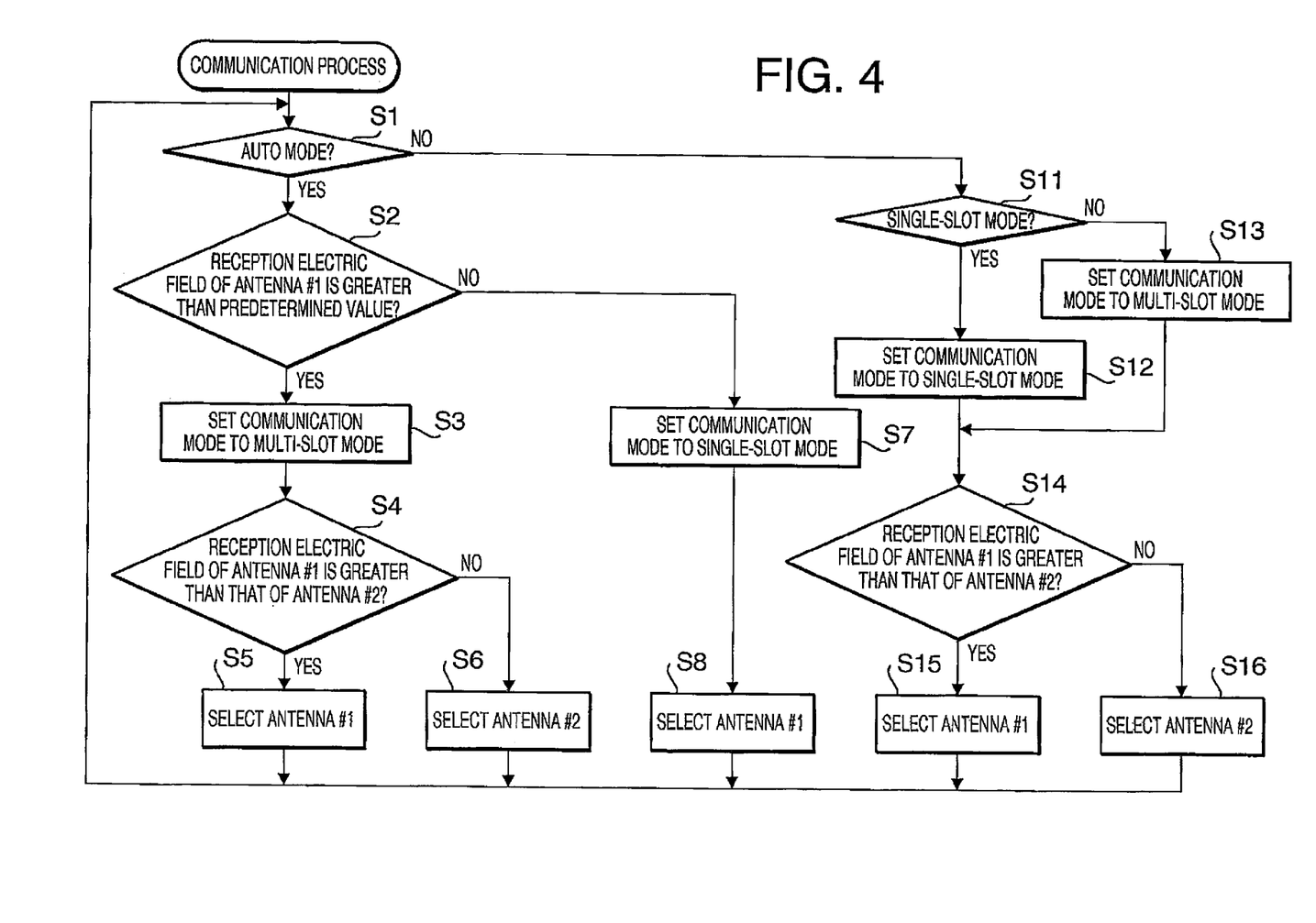
FIG. 4 is a flow chart showing a communication process according to an embodiment of the present invention.

A reception process which executes a process of a flow chart shown in FIG. 4 is stored as one of the control programs. In the reception process, one of the main antenna 1 and the sub-antenna 2 to be used, and switching control between a single-slot mode and a multi-slot mode, are executed depending on the received electric field level and the bit error rate.

When switching between the single-slot mode and the multi-slot mode is executed, the control unit 10 informs the main apparatus 200 of the execution of the switching through an open slot. Thus, the main apparatus 200 executes the switching control in response to the switching control at the cordless handset.

Figure 2:
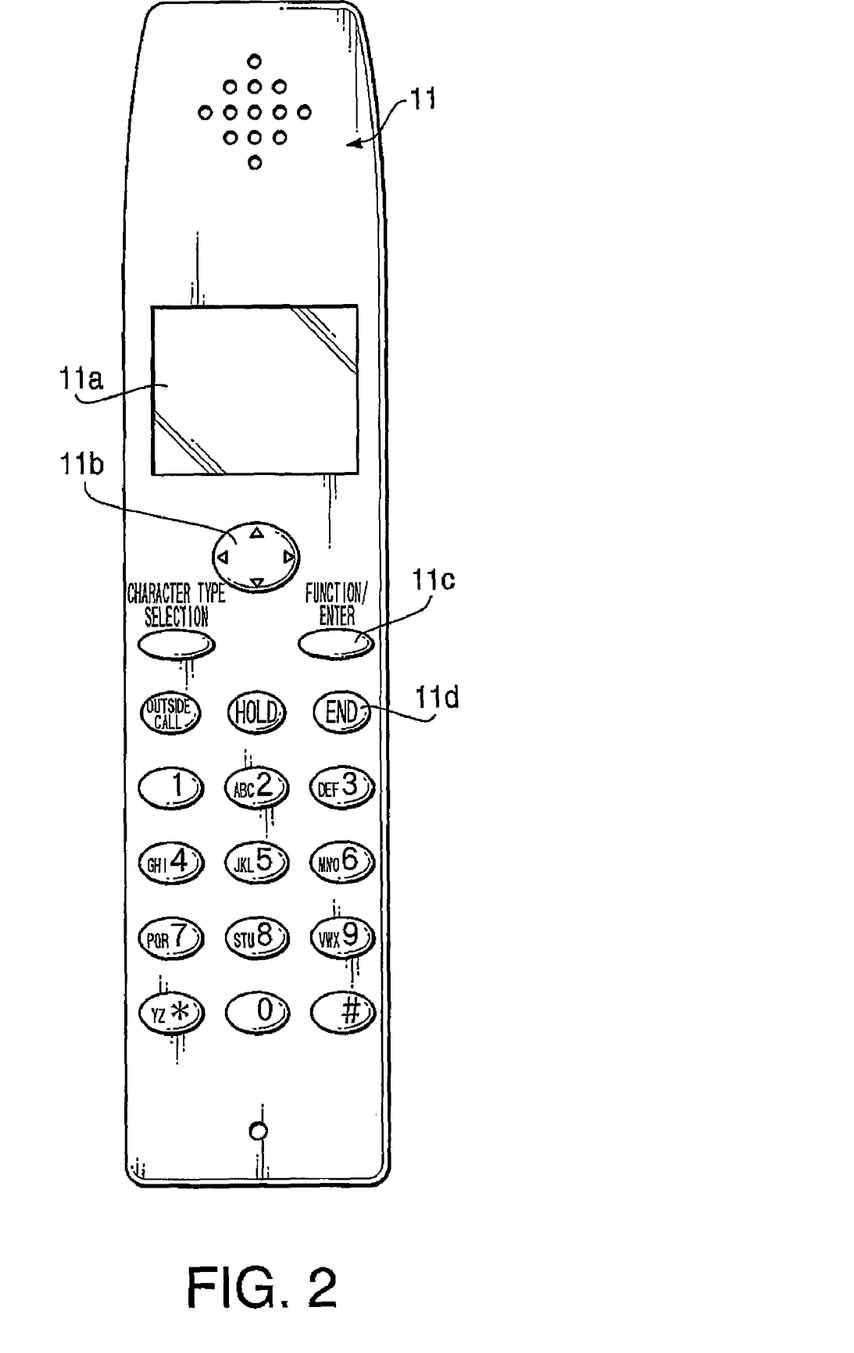
FIG. 2 illustrates an operation panel showing the details of an operating unit according to an embodiment of the present invention.

The operating unit 11 is provided with a display screen and a plurality of switches, which will be described in detail later with reference to FIG. 2. It is noted here that the communication mode (hereinafter, referred to as "call mode") can be set by operating these switches provided to the operating unit 11. A call mode includes an automatic mode in which switching between the single-slot mode and the multi-slot mode is operated automatically, the single-slot mode, and the multi-slot mode, so that the call mode can be set to one of these three modes with the switches provided to the operating unit. When the automatic mode is selected, setting of which antenna to be used depending on the reception electric field levels of the main antenna 1 and the sub-antenna 2, and switching control between the single-slot mode and multi-slot mode are to be executed under control of the control unit 10.

When the single-slot mode is selected, the control unit 10 determines which one of the main antenna 1 and the sub-antenna 2 is to be used depending on the reception electric field levels, and communication in the single-slot mode is executed using the selected antenna. When the multi-slot mode is selected, the control unit 10 determines which one of the main antenna 1 and the sub-antenna 2 is to be used depending on the reception electric field levels, and communication in the multi-slot mode is executed using the selected antenna.

Next, referring to FIG. 2, about the operating unit 11 will be described. FIG. 2 illustrates an operation panel showing the details of an operating unit 11 according to an embodiment of the present invention. As shown in FIG. 2, the operation panel 11 of the cordless communication apparatus 100 is provided an LCD screen 11a for displaying telephone numbers and menus, and various buttons such as a cursor button 11b for directing motion of a cursor 11e (ref. FIG. 3), a FUNCTION/ENTER button 11c which is used for selecting functions and determining the selected function, a END button 11d for instructing termination of calling and setting of functions, and other buttons including a numeric keypad to input telephone numbers and characters, a CHARACTER TYPE SELECTION button to switch among characters to be inputted by the numeric keypad such as number symbols and Katakana, an outside call button to be used for making an outside call, and a HOLD button for putting the call on hold.

The cursor button 11b allows a user to move the cursor 11e displayed in the LCD screen 11a in one of the four directions by pushing one of the positions which are indicated on the upper surface of the button as four triangles pointing four directions respectively right and left, and up and down.

Figure 3A:
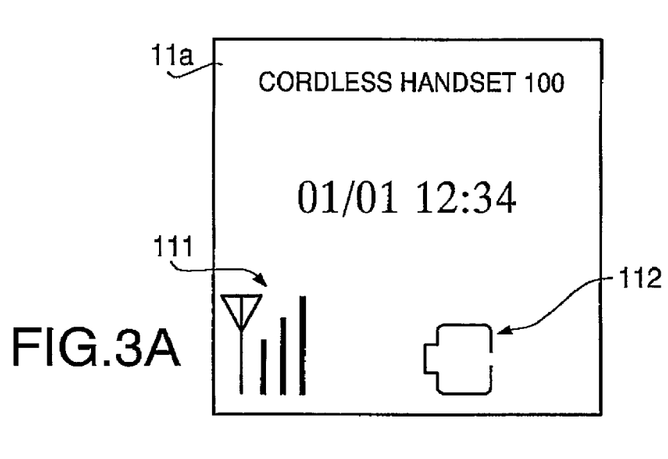
FIG. 3A shows a screen in a standby mode.
Figure 3B:
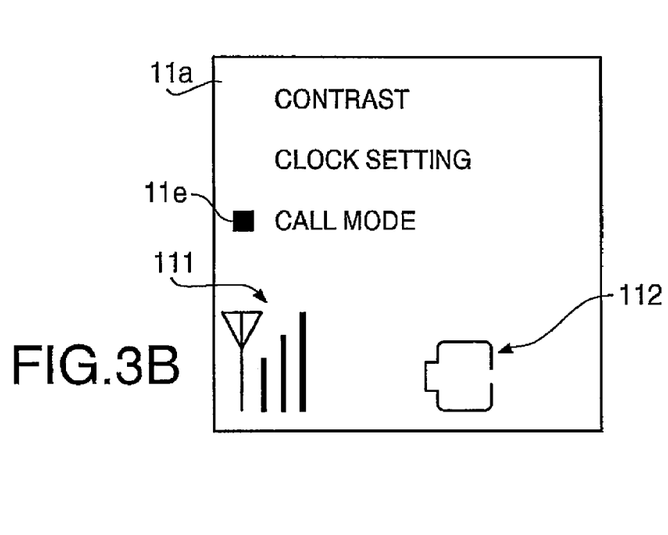
FIG. 3B shows a function selection screen.
Figures 3C, 3D:
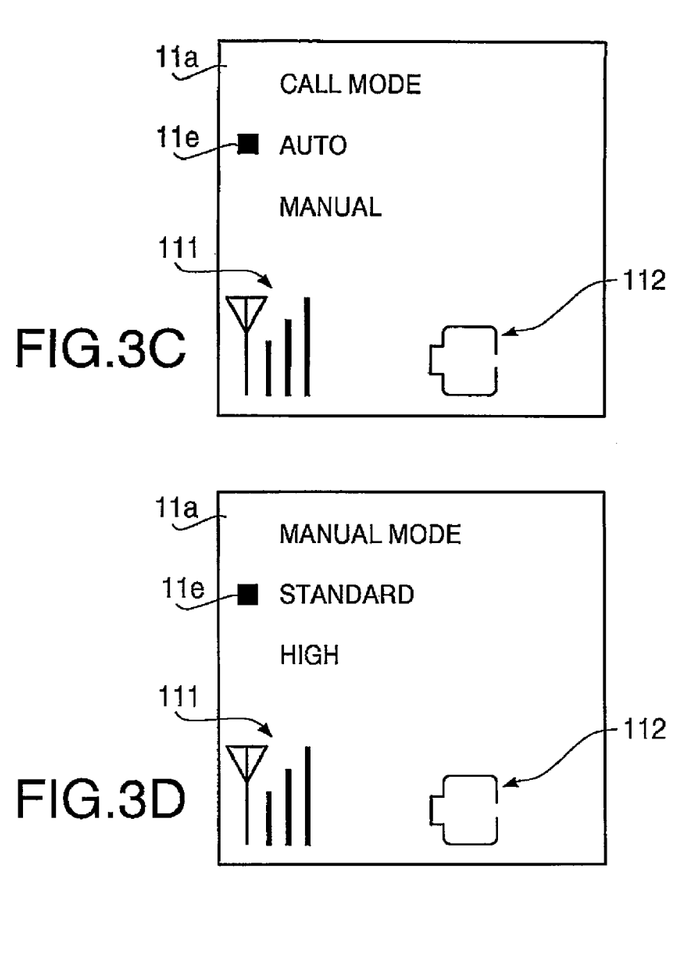
FIG. 3C shows a primary call mode selection screen.
FIG. 3D shows a secondary call mode selection screen.

Next, referring to FIGS. 3A-3D, operating steps to set the call mode, and screens displayed on the LCD screen 11a during the steps will be described will be described. FIGS. 3A-3D illustrate display screens for setting a call mode. Specifically, FIG. 3A shows a screen in a standby mode, FIG. 3B shows a function selection screen, FIG. 3C shows a screen for selecting a primary call mode, and FIG. 3D shows a screen for selecting a secondary call mode.

When the cordless communication apparatus 100 is in the standby mode, as shown in FIG. 3A, "CORDLESS HANDSET 100" indicating, for example, the 1st cordless handset among a plurality of cordless handsets, date and time (e.g., "01/01 12:30"), a graphic indicating an electric wave receiving condition, and another graphic indicating a battery consumption condition are to be displayed.

In this standby mode, a selectable function is displayed each time of pushing the FUNCTION/ENTER button 11c. FIG. 3B is the function selection screen displayed by such operation. In this display, "CONTRAST OF THE SCREEN" to set contrast of the display screen, "TIME SETTING" to set the clock, and "CALL MODE" to set the call mode are selectively indicated.

In the screen shown in FIG. 3B, when the cursor 11e is positioned to the "CALL MODE" by manipulating the cursor button 11b, and the FUNCTION/ENTER button 11c is pushed, the screen for selecting the primary call mode shown in FIG. 3C is displayed. Specifically, "AUTOMATIC" indicating an automatic mode to switch between the single-slot mode and the multi-slot mode automatically depending on the electric wave conditions, and "MANUAL" indicating a manual mode which is selected by a user are indicated.

In this screen, by positioning the cursor 11e to "AUTOMATIC", the automatic mode, and pushing the FUNCTION/ENTER button 11c, the call mode is set to the automatic mode, and by positioning the cursor 11e to "MANUAL", the manual mode, and pushing the FUNCTION/ENTER button 11c, "MANUAL MODE" for selecting the secondary call mode shown in FIG. 3D is indicated. In this secondary call mode selection screen, "STANDARD" which is corresponding to the single-slot mode, and "STRONG" which is corresponding to the multi-slot mode are indicated, and by positioning the cursor 11e to either of them and pushing the FUNCTION/ENTER button 11c, the corresponding mode is selected. Herewith, by pushing the CLOSE (hang-up) button 11d after setting the call mode, the screen returns to the standby mode shown in FIG. 3A.

Next, a reception control process to executed by the CPU 10A will be described with reference to FIG. 4, which shows a flow chart illustrating the reception control process according to an embodiment of the present invention. The reception control process is activated when the cordless communication apparatus 100 is powered on. In the explanation of the reception control process, the main antenna 1 will occasionally be referred to as "antenna #1", and the sub-antenna 2 will occasionally be referred to as an "antenna #2".

First, it is judged whether the call mode is already set to the automatic mode on the operating unit 11 by a user (S1). If the call mode is already set to the automatic mode (S1: YES), whether the reception electric field level of the antenna #1 is higher than the predetermined level is judged (S2).

If the reception electric field level of the antenna #1 is not higher than the predetermined level (S2: NO), the call mode is set to the multi-slot mode (S3), and then it is judged whether the reception electric field level of the antenna #1 is higher by comparison of the reception electric field level of the antenna #1 with the reception electric field level of the antenna #2 (S4). If the reception electric field level of the antenna #1 is higher (S4: YES), the call mode is set to the antenna #1 for executing transmission and reception (S5). If the reception electric field level of the antenna #1 is not higher (S4: NO), the call mode is set to the antenna #2 for executing transmission and reception (S6).

If the reception electric field level of the antenna #1 is higher than the predetermined level (S2: YES), the call mode is set to the single-slot mode (S7), and the antenna #1 is selected for executing transmission and reception (S8). When the process of S5, S6 or S8 is terminated, the control returns to the process of S1.

If the call mode is not set to the automatic mode in the judgment process of S1 (S1: NO), it is judged whether the single-slot mode is already selected in the call mode on the operating unit 11 by the user (S11). If the single-slot mode is already selected (S11: YES), the call mode is set to the single-slot mode for executing transmission and reception (S12). If the single-slot mode is not selected (S11: NO), the call mode is set to the multi-slot mode for executing transmission and reception (S13).

When setting of call mode is terminated in S12 or S13, it is judged whether the reception electric field level of the antenna #1 is higher by comparison of the reception electric field level of the antenna #1 and the reception electric field level of the antenna #2 (S14). If the reception electric field level of the antenna #1 is higher (S14: YES), the call mode is set to the antenna #1 for executing transmission and reception (S15). If the reception electric field level of the antenna #1 is not higher (S14: NO), the call mode is set to the antenna #2 for executing transmission and reception (S16). When a process of S15 or S16 is terminated, the control returns to the process of S1. In addition to the process above, for executing the process of S2, instead of judgment by detecting the reception electric field level of the antenna #1, it may be judged by the bit error rate which is detected by the bit error rate detecting unit 8a of the DSP 8. Also, for selecting an antenna between the antenna #1 and the antenna #2, it may be judged by comparison of each bit error rate of the antennas detected by a bit error rate detecting system and the antenna which is lower in the bit error rate is to be selected.

As explained above, according to a first embodiment of the present invention, if the reception electric field level of the main antenna 1 is higher than the predetermined level, transmission and reception is executed by the main antenna 1 while the call mode is set to the single-slot mode for executing communication. If the reception electric field level of the main antenna 1 is not higher than the predetermined level, the call mode is set to the multi-slot mode, and transmission and reception is to be executed by the antenna which is higher in the reception electric field level by comparison of the reception electric field levels between the main antenna 1 and the sub-antenna 2. Therefore, even if the cordless handset is moved to a position in a weak electric field, it is capable of communication without degrading communication quality.

Further, switching between the single-slot mode and the multi-slot mode can be operated by a user without depending on the reception electric field levels of antennas, thus the optimal call mode, free from communication quality degradation, by judgment of the user, is available.

Figure 5:
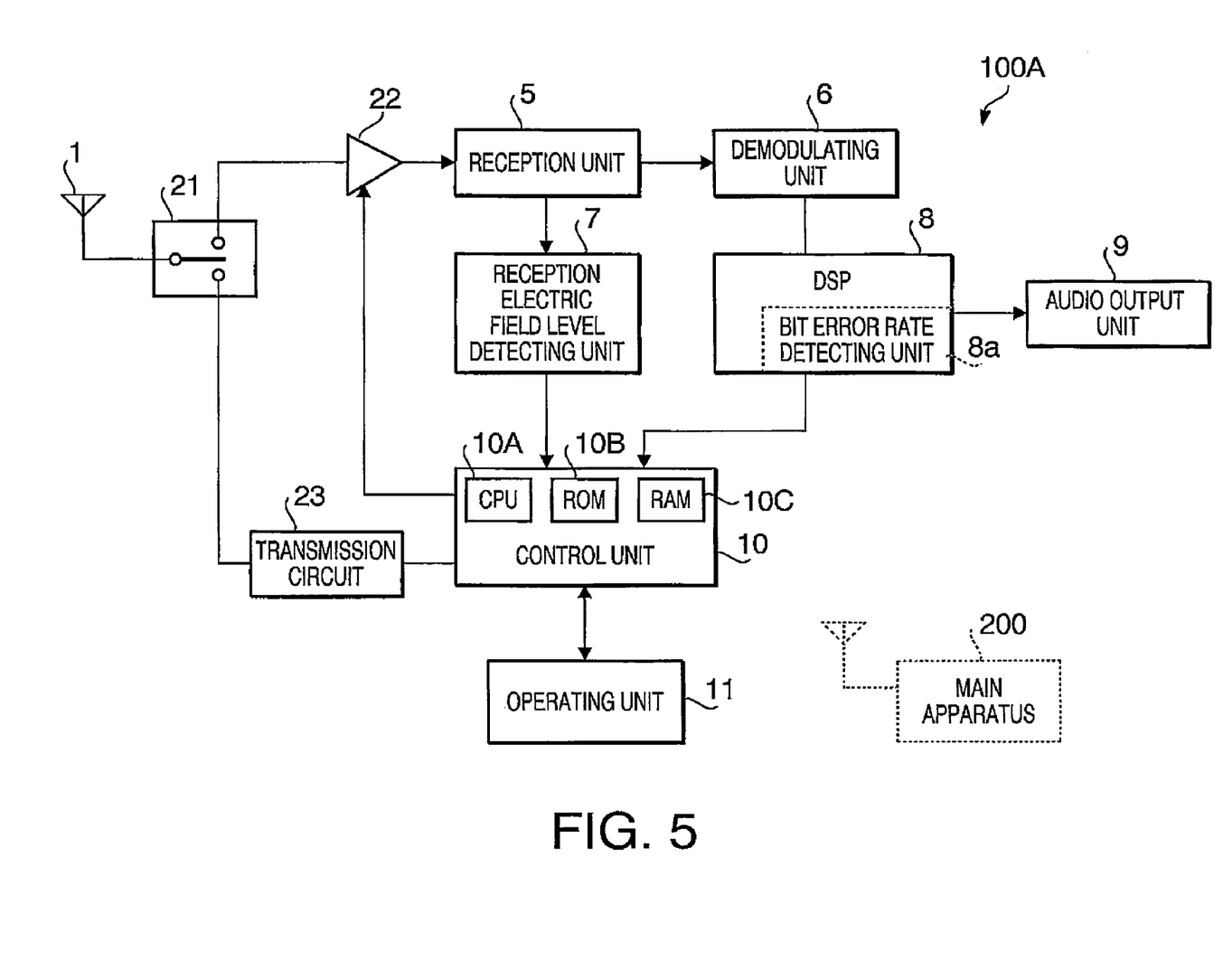
FIG. 5 is a block diagram showing a configuration of a cordless communication apparatus according to a second embodiment of the present invention.

Next, referring to FIG. 5 and FIG. 6, a second embodiment of the present invention will be described. FIG. 5 is a block diagram showing a configuration of a cordless communication apparatus 100A according to a second embodiment. Meanwhile, the same reference numerals/symbols are put respectively for the units identical to the first embodiment, and the explanations will be omitted/simplified for brevity. As shown in FIG. 5, the cordless communication apparatus 100A is different from the first embodiment in that the main antenna 1, a switch 21 for switching between transmission and reception, an amplifier 22 for amplifying received electric field, and a transmission circuit 23 are provided, while the sub-antenna 2, and the antenna selector switch 4 for switching between the main antenna 1 and the sub-antenna 2, they are provided in the first embodiment, are not provided herewith.

In this cordless communication apparatus 100A, the switch 21 is shifted to and from at the time of transmission and at the time of reception. The anterior half of each frame is for the time of transmission and the posterior half is for the time of reception. During reception time, the reception electric field received by the main antenna 1 is to be inputted to the amplifier 22. In the amplifier 22, a gain (amplification factor) is divided into two phases by the control unit 10. To put it plainly, if the reception electric field level detected by the detecting unit 7 is higher than a predetermined threshold, the gain is to be set to small, or if the reception electric field level is lower than the predetermined threshold, the gain is to be set to large. Also, when the call mode is already set to the automatic mode on the operating unit 11 by a user, if the gain is set to large, the call mode is to be set to the multi-slot mode, or if the gain is set to small, the call mode is to be set to the single-slot mode.

If the call mode is already set to the single-slot mode on the operating unit 11 by a user, the call mode is to be set to the single-slot mode regardless of gain, or if the call mode is already set to the multi-slot mode, the call mode is to be set to the multi-slot mode.

Figure 6:
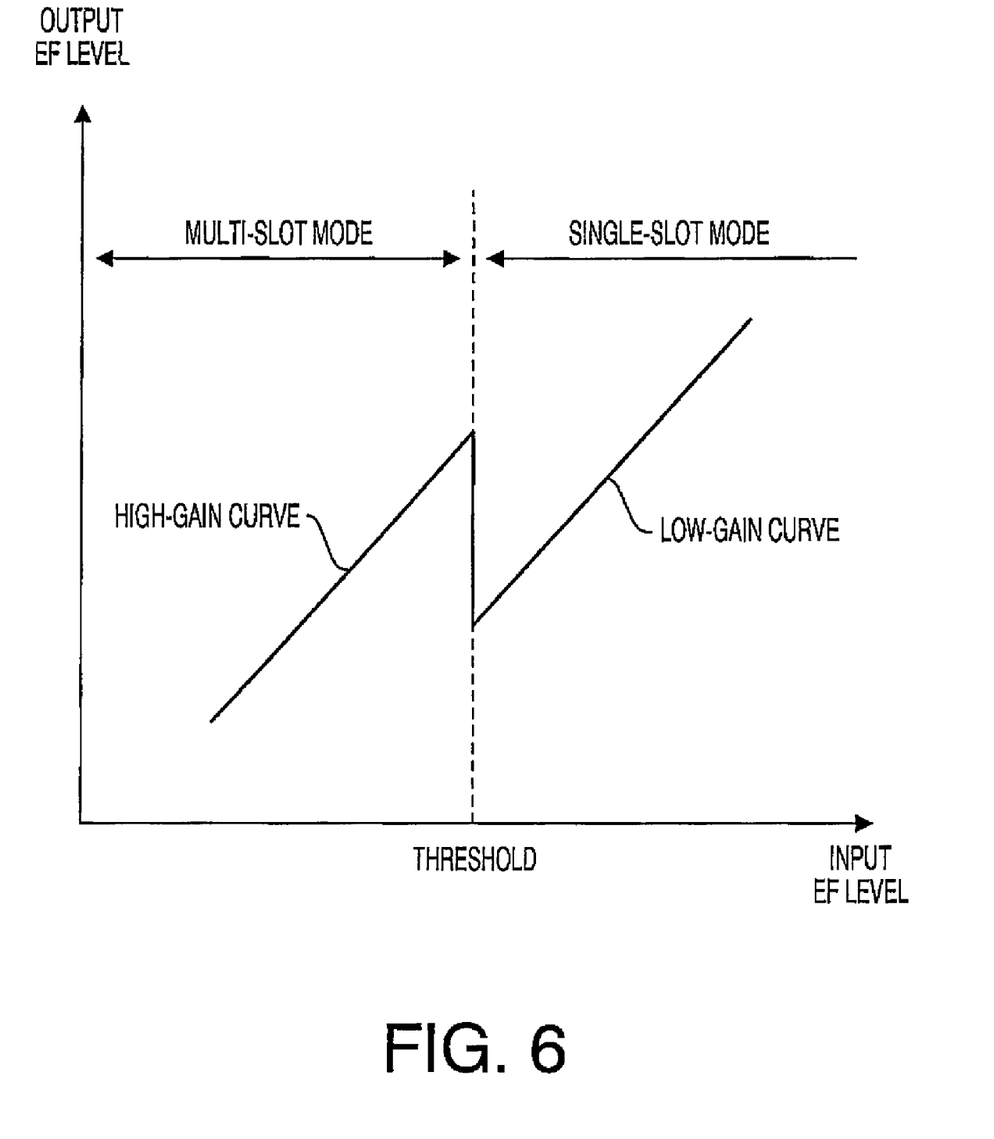
FIG. 6 is a graph showing the relationship between input reception electric field levels and outputs according to a second embodiment of the present invention.

FIG. 6 is a graph showing the switching of the reception electric field levels and modes when the call mode is set to the automatic mode. On this graph, the horizontal axis is a reception electric field level to be inputted into the amplifier 22, and the vertical axis is a reception electric field level amplified by the amplifier 22.

As shown in FIG. 6, if the input reception electric field level is higher than the threshold, gain is to be set to small (low gain curve) while the call mode is to be set to the single-slot mode, or if the input reception electric field level is lower than the threshold, gain is to be set to large (high gain curve) while the call mode is to be set to the multi-slot mode.

As explained above, according to a second embodiment, if the input reception electric field level is high, gain of the amplifier 22 is to be set to small while the call mode is to be set to the single-slot mode, or if the input reception electric field level is low, gain of the amplifier 22 is to be set to large while the call mode is to be set to the multi-slot mode, therefore, even if the electric field is weak, it is capable of communication without degrading communication quality.

As thus far described, the present invention has been explained based on the embodiments above, however, the present invention is not to be limited to the what is shown in the drawings and described in the specification including embodiments and claims. It will be obvious that various changes and improvements may be made without departing from the scope of the present invention.

For example, although the cordless communication apparatus 100 is described as a cordless handset of telephone equipment according to the embodiments above, it may be a cordless handset of an MFP (multiple function peripheral) having multiple functions, such as a facsimile function and a copying function, instead.

Although the main antenna and sub-antenna are switched depending on the detected reception electric field levels of the main antenna and the sub-antenna and also the single-slot mode and the multi-slot mode are switched according to the first embodiment above, however instead of above, it is possible that an amplifier for amplifying the reception electric field level received by an antenna is to be provided in the first embodiment, as described in the second embodiment, and if the reception electric field level is low, the gain of the amplifier is to be large while the call mode is to be set to the multi-slot mode, or if the reception electric field level is high, the call mode is to be set to the single-slot mode.

Further, according to the embodiments above, the call mode is set by a cordless handset (cordless communication apparatus 100, 100A), and when the automatic mode is selected, decision of which mode to select between the single-slot mode or the multi-slot mode for executing communication is made in the cordless handset by detecting communication conditions, however, it is also possible that decision of which mode to select between the single-slot mode or the multi-slot mode for executing communication is made in the main apparatus 200 by detecting communication conditions.

Moreover, according to the embodiments above, when either of the single-slot mode or the multi-slot mode is already selected on the operating unit 11 by a user, either of the main antenna 1 or the sub-antenna 2 is to be selected depending on the reception electric field levels of antennas, however instead of above, the main antenna 1 may be used when the single-slot mode is selected, and the sub-antenna 2 may be used when the multi-slot mode is selected.

Furthermore, although communication conditions are judged by any of the reception electric field level or the bit error rate in the embodiments above, it may be also judged by the both values. For example, if the reception electric field level is lower than the predetermined level and also the bit error rate is lower than the predetermined rate, it may be judged as weak in electric field, and then the single-slot mode may be switched to the multi-slot mode. Additionally, an operating member may be provided for making an arbitrary selection by either of the reception electric field level or the bit error rate, to consider that electric wave conditions differ depending on where the cordless communication apparatus 100 is located.

What is claimed is:

1. A cordless communication apparatus, comprising:
   a communication mode setting unit configured to switch between a single-slot mode for executing communication using one of a plurality of slots included in one frame, and a multi-slot mode for executing communication using more than one slots of the plurality of slots included in one frame, a wireless communication being executed in a communication mode selected by the communication mode setting unit;
   a first antenna and a second antenna, the first antenna being higher in sensitivity than the second antenna, and the first antenna having a different directional characteristic than the second antenna;
   an antenna setting unit configured to switch between the a-first antenna and the a-second antenna;
   a communication condition detecting unit configured to detect a communication condition of each of the first antenna and the second antenna, the communication condition detecting unit is provided with the a reception electric field detecting unit detect reception electric field of the first antenna and the second antenna;
   a controlling unit configured to control the antenna setting unit and the communication mode setting unit, such that:
   when the communication condition of the first antenna detected by the communication condition detecting unit is better than a predetermined communication condition including a condition where the reception electric fields is greater than a predetermined level, the controlling unit controls the antenna setting unit to select the first antenna for reception and controls control the communication mode setting unit to set the communication mode to the single-slot mode,
   when the communication condition of the first antenna detected by the communication condition detecting unit is not better than the a-predetermined communication condition, the controlling unit controls the communication mode setting unit to set the communication to the multi-slot mode, the controlling unit compares the condition of the first antenna with the condition of the second antenna, and if the communication condition of the first antenna detected by the communication detecting unit is better than the communication condition of the second antenna detected by the communication detecting unit, the controlling unit controls the antenna setting unit to select the first antenna for reception, and if the communication condition of the second antenna detected by the communication condition detecting unit is better than the communication condition of the first antenna detected by the communication condition detecting unit, the controlling unit controls the antenna setting unit to select the second antenna for reception,
   an amplifier configures to amplify electric field signal received by either of the first antenna and the second antenna, wherein the controlling unit sets a gain of the amplifier to a first value the reception electric field level detected by the reception electric field level detecting unit is higher than the predetermined level, while sets the gain of the amplifier to a second value which is larger than the first value when the reception electric field level detected by the reception electric field level detecting unit is not higher than the predetermined level.

2. The cordless communication apparatus according to claim 1, wherein the communication condition detecting unit is provided with a bit error rate detecting unit configured to detect a bit error rate of a digital signal received by each of the first antenna and the second antenna, the predetermined condition including a condition where the bit error rate is less than a predetermined value.

3. The cordless communication apparatus according to claim 1, wherein the communication mode setting unit is provided with an operating member configured to select the communication mode to arbitrary one of the single-slot mode and the multi-slot mode.

4. A method of receiving communication frames with a cordless communication apparatus which is configured such that a single-slot mode for executing communication using one of a plurality of slots included in one frame, and a multi-slot mode for executing communication using more than one slots of the plurality of slots included in one frame can be switched, a wireless communication being executed in a communication mode selected by the communication mode setting unit, the cordless communication apparatus being provided with a first antenna and a second antenna having different receiving characteristics and an amplifier configures to amplify electric field signal received by either of the first antenna and the second antenna, the method comprising the steps of:

detecting a communication condition of each of the first antenna and the second antenna;

selecting the first antenna for reception and setting the communication mode to the single-slot mode when the communication condition of the first antenna detected by the communication condition detecting unit is better than a predetermined communication condition, the predetermined condition including a condition where the reception electric field level is greater than a predetermined level; setting a gain of the amplifier to a first value the reception electric field level is higher than the predetermined level, while setting the gain of the amplifier to a second value which is larger than the first value when the reception electric field level is not higher than the predetermined level; and     when the communication condition of the first antenna detected by the communication condition detecting unit is not better than a predetermined communication condition, setting the communication mode to the multi-slot mode and comparing the condition of the first antenna with the condition of the second antenna, if the communication condition of the first antenna is better than the communication condition of the second antenna, selecting the first antenna for reception, and if the communication condition of the second antenna is better than the communication condition of the first antenna, selecting the second antenna for reception.

5. The method according to claim 4, wherein the predetermined condition including a condition where the bit error rate is less than a predetermined value.

6. The cordless communication apparatus according to claim 1, further comprising a receiving unit connectable to the first antenna and the second antenna and configured to receive electric wave signals from the first antenna and the second antenna, respectively, obtain information necessary for detecting the communication condition based on the electric wave signals, and output the information to the communication condition detecting unit,     wherein the antenna setting unit switches the first antenna and the second antenna such that the antenna setting unit connects one of the first antenna and the second antenna to the receiving unit while disconnects the other one of the first antenna and the second antenna from the receiving unit.

7. The method according to claim 4, further comprising a step of receiving, with use of a receiving unit connectable to the first antenna and the second antenna, electric wave signals from the first antenna and the second antenna, respectively, obtaining information necessary in the detecting step for detecting the communication condition based on the electric wave signals, and outputting the information,     wherein the selecting step selects one of the first antenna and the second antenna such that the selecting step connects one of the first antenna and the second antenna to the receiving unit while disconnects the other one of the first antenna and the second antenna from the receiving unit.

* * * * *